(12) United States Patent
Zhang

(10) Patent No.: US 12,532,593 B2
(45) Date of Patent: Jan. 20, 2026

(54) LIGHT EMITTING DEVICE AND METHOD FOR MANUFACTURING LIGHT EMITTING DEVICE

(71) Applicant: ENKRIS SEMICONDUCTOR, INC., Suzhou (CN)

(72) Inventor: Liyang Zhang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 456 days.

(21) Appl. No.: 18/151,627

(22) Filed: Jan. 9, 2023

(65) Prior Publication Data
US 2023/0335576 A1    Oct. 19, 2023

(30) Foreign Application Priority Data
Apr. 19, 2022 (CN) .......................... 202210409824.9

(51) Int. Cl.
H10H 29/14 (2025.01)
(52) U.S. Cl.
CPC ................. H10H 29/142 (2025.01)
(58) Field of Classification Search
None
See application file for complete search history.

(56) References Cited

U.S. PATENT DOCUMENTS

| | | | | |
|---|---|---|---|---|
| 2008/0048176 A1* | 2/2008 | Orita | .................... | H10D 62/117 |
| | | | | 257/E33.068 |
| 2013/0334550 A1* | 12/2013 | Yoon | .................... | H10H 20/811 |
| | | | | 257/94 |
| 2015/0009108 A1* | 1/2015 | Song | .................... | G09G 3/3225 |
| | | | | 345/80 |
| 2020/0066944 A1* | 2/2020 | Lee | ..................... | H10H 20/856 |
| 2021/0050482 A1* | 2/2021 | Breva | ................. | H10H 20/841 |

* cited by examiner

Primary Examiner — Bilkis Jahan
(74) Attorney, Agent, or Firm — Westbridge IP LLC

(57) ABSTRACT

Disclosed are a light emitting device and a method for manufacturing a light emitting device. The light emitting device according to the present application may be formed by an epitaxial growth process. In addition, the light emitting device according to the present application includes a first semiconductor layer, a light emitting layer and a second semiconductor layer. Light emitting wavelengths of the first region, the second region and the third region are different by setting composition of the light emitting layer of the top walls of the plurality of protrusions, the side walls of the plurality of protrusions and the recessed region between the plurality of protrusions to be different, therefore, the light-emitting device may emit light of different wavelengths without using phosphors or quantum dots for wavelength conversion, thereby prolonging the lifespan of the light-emitting device and improving the reliability of the light-emitting device.

15 Claims, 7 Drawing Sheets

LIGHT EMITTING DEVICE AND METHOD FOR MANUFACTURING LIGHT EMITTING DEVICE

CROSS-REFERENCE TO RELATED APPLICATION

This application claims priority to Chinese Patent Application No. 202210409824.9, filed on Apr. 19, 2022, which is hereby incorporated by reference in its entirety.

TECHNICAL FIELD

The present application relates to the field of semiconductor technologies, in particular to a light emitting device and a method for manufacturing a light emitting device.

BACKGROUND

Light Emitting Diode (LED) emits visible light by using recombination between electrons and holes. Two main application fields for LED include lighting and display. In the related art, full-color LED packaging units and dot-matrix LED displays are large in size and high in cost. In addition, in the related art, wavelength conversions of a light emitting layer of the LED are realized by using phosphors or quantum dots, such as, a blue LED adding red-green phosphors or an ultraviolet LED adding blue-green-red phosphors. However, short lifetimes and poor reliability of phosphors or quantum dots, resulting in short lifetimes and poor reliability of LED.

SUMMARY

In view of this, embodiments of the present application provide a light emitting device and a method for manufacturing a light emitting device, which solve a problem of large size, high cost, short lifetimes and poor reliability of the light emitting device.

According to a first aspect, an embodiment of the present application provides a light emitting device including: a first semiconductor layer including a plurality of protrusions and a recessed region between the plurality of protrusions; a light emitting layer including a first region, a second region and a third region; the first region being configured to cover the recessed region, the second region being configured to cover side walls of the plurality of protrusions, and the third region being configured to cover top walls of the plurality of protrusions; and a second semiconductor layer covering the light emitting layer. A conductive type of the second semiconductor layer is opposite to a conductive type of the first semiconductor layer. Light emitting wavelengths of the first region, the second region and the third region are different by setting composition of the light emitting layer of the top walls of the plurality of protrusions, the side walls of the plurality of protrusions and the recessed region between the plurality of protrusions to be different.

With reference to the first aspect, in an embodiment of the present application, the light emitting layer includes: a plurality of light emitting units, each of the plurality of light emitting units including a first light emitting sub-region, a second light emitting sub-region and a third light emitting sub-region, an insulating wall being disposed at a junction of the first light emitting sub-region, the second light emitting sub-region and the third light emitting sub-region, the insulating wall being disposed between adjacent light emitting units, the first light emitting sub-region being located in the first region, the second light emitting sub-region being located in the second region and the third light emitting sub-region being located in the third region.

With reference to the first aspect, in an embodiment of the present application, the light emitting device further includes: a first metal electrode layer disposed on a surface of the first semiconductor layer away from the light emitting layer; and a second metal electrode layer disposed on a surface of the second semiconductor layer away from the light emitting layer. The first metal electrode layer includes a plurality of first metal electrodes. The first light emitting sub-region, the second light emitting sub-region and the third light emitting sub-region of each of the plurality of light emitting units correspond to respective first metal electrodes, and the first light emitting sub-region, the second light emitting sub-region and the third light emitting sub-region of the plurality of light emitting units share the second metal electrode layer.

With reference to the first aspect, in an embodiment of the present application, an area of the first light emitting sub-regions included in the plurality of light emitting units accounts for between 0% and 90% of an area of the recessed region; an area of the second light emitting sub-regions accounts for between 0% and 90% of an area of side walls of the plurality of protrusions corresponding to the second light emitting sub-region; and an area of the third light emitting sub-regions accounts for between 0% and 90% of an area of top walls of the plurality of protrusions corresponding to the third light emitting sub-region.

With reference to the first aspect, in an embodiment of the present application, the plurality of protrusions are protruding platforms, and a top surface shape of the protrusion includes at least one of the following shapes: triangle, square, rectangle, hexagon, octagon, circle.

With reference to the first aspect, in an embodiment of the present application, each of the plurality of light emitting units corresponds to at least one protrusion, the first light emitting sub-region corresponds to recessed region adjacent to the at least one protrusion, the second light emitting sub-region corresponds to side walls of the at least one protrusion, and the third light emitting sub-region corresponds to at least one top wall of the at least one protrusion.

With reference to the first aspect, in an embodiment of the present application, the plurality of protrusions include a first protrusion and a second protrusion, the first protrusion is a protruding platform, the second protrusion is a cone, and a horizontal size of the first protrusion is larger than a horizontal size of the second protrusion.

With reference to the first aspect, in an embodiment of the present application, each of the plurality of light emitting units correspond to at least one first protrusion, at least one second protrusion and a recessed region between the at least one first protrusion and the at least one second protrusion, the first light emitting sub-region corresponds to the recessed region, the second light emitting sub-region corresponds to side walls of the at least one second protrusion, and the third light emitting sub-region corresponds to top walls of the at least one first protrusion.

With reference to the first aspect, in an embodiment of the present application, the plurality of light emitting units including a first type of light emitting unit and a second type of light emitting unit. A light emitting area of the first type of light emitting unit is larger than a light emitting area of the second type of light emitting unit, and a number of the protrusion corresponding to the first type of light emitting unit and a number of the protrusion corresponding to the second type of light emitting unit are same or different; and/or a type of the protrusion corresponding to the first type of light emitting unit and a type of the protrusion corresponding to the second type of light emitting unit are same or different.

With reference to the first aspect, in an embodiment of the present application, a spacing between adjacent protrusions is less than 50 microns.

With reference to the first aspect, in an embodiment of the present application, an arrangement of the plurality of protrusions including any one of the following arrangements: a rectangular array arrangement and a diamond arrangement.

With reference to the first aspect, in an embodiment of the present application, heights of the plurality of protrusions are less than 50 microns.

With reference to the first aspect, in an embodiment of the present application, the light emitting layer includes a single quantum well layer or a multiple quantum well layer. The single quantum well layer or the multiple quantum well layer includes element In.

According to a second aspect, an embodiment of the present application provides a method for manufacturing a light emitting device, including: providing a first semiconductor layer including a plurality of protrusions and a recessed region between the plurality of protrusions; forming a light emitting layer including a first region, a second region and a third region; the first region being configured to cover the recessed region, the second region being configured to cover side walls of the plurality of protrusions, and the third region being configured to cover top walls of the plurality of protrusions; and forming a second semiconductor layer covering the light emitting layer. A conductive type of the second semiconductor layer is opposite to a conductive type of the first semiconductor layer. Light emitting wavelengths of the first region, the second region and the third region are different by setting composition of the light emitting layer of the top walls of the plurality of protrusions, the side walls of the plurality of protrusions and the recessed region between the plurality of protrusions to be different.

With reference to the second aspect, in an embodiment of the present application, the providing a first semiconductor layer, including: providing a substrate including a plurality of protrusion portions and a recessed portion between the plurality of protrusion portions; and performing epitaxial growth on the substrate to obtain the first semiconductor layer including the plurality of protrusions and the recessed region between the plurality of protrusions.

According to the embodiments of the present application, the light emitting device may be formed by an epitaxial growth process. In addition, the light emitting device according to the present application includes a first semiconductor layer, a light emitting layer and a second semiconductor layer. Light emitting wavelengths of the first region, the second region and the third region are different by setting composition of the light emitting layer of the top walls of the plurality of protrusions, the side walls of the plurality of protrusions and the recessed region between the plurality of protrusions to be different. Specifically, a growth rate of the light emitting layer corresponding to each surface is different, and doping efficiency of a light emitting wavelength sensitive element in a grown light emitting layer is different, so that a composition ratio of each light emitting wavelength sensitive element in the grown light emitting layer is different. Therefore, the light emitting device may emit light of different wavelengths without using phosphors or quantum dots for wavelength conversion, thereby prolonging lifetimes of the light emitting device and improving reliability of the light emitting device. The above process is simple, and a full-color LED structural unit is formed in one epitaxial growth process of the light emitting layer, thereby reducing a size of the full-color LED, reducing costs, prolonging lifetimes, and improving reliability.

DETAILED DESCRIPTION OF THE EMBODIMENTS

The technical schemes in the embodiments of the present disclosure will be described clearly and completely below in combination with the accompanying drawings in the embodiments of the present disclosure. Obviously, the described embodiments are only a part of the embodiments of the present disclosure, not all of the embodiments. Based on the embodiments in the present disclosure, all other embodiments obtained by those skilled in the art without creative efforts shall fall within the protection scope of the present disclosure.

Figure 1:
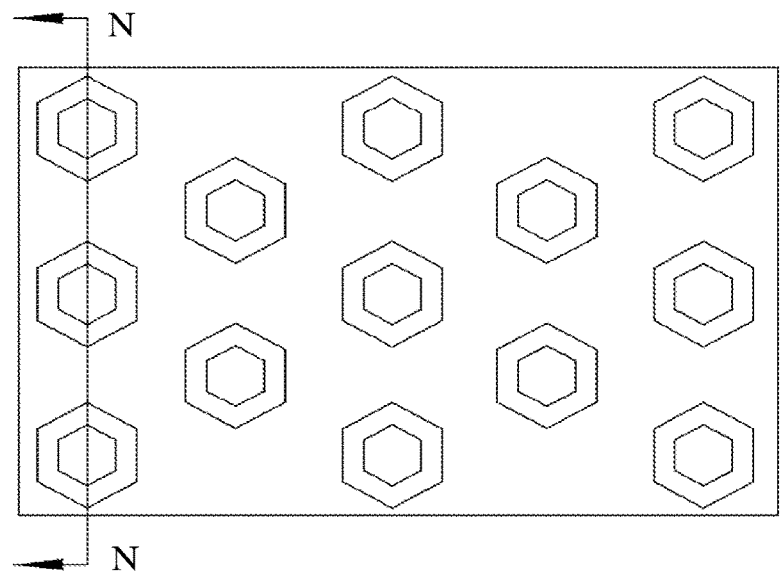
FIG. 1 is a schematic top view of a light emitting device according to an embodiment of the present application.
Figure 2A:
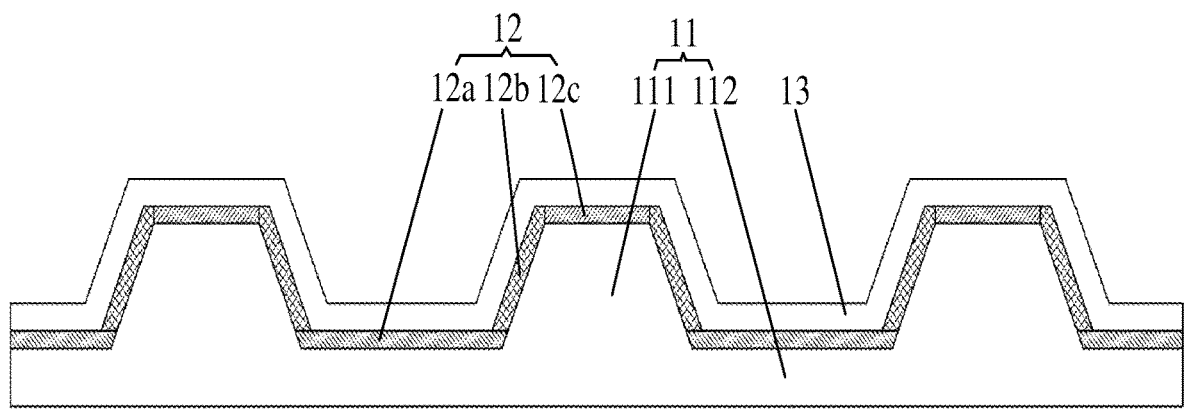
FIG. 2a is a schematic cross-sectional view of the light emitting device in N-N direction shown in FIG. 1.

FIG. 1 is a schematic top view of a light emitting device according to an embodiment of the present application. FIG. 2a is a schematic cross-sectional view of the light emitting device in N-N direction shown in FIG. 1. As shown in FIG. 1 and FIG. 2a, a light emitting device according to an embodiment of the present application includes: a first semiconductor layer 11, a light emitting layer 12, and a second semiconductor layer 13.

Specifically, the first semiconductor layer 11 includes a plurality of protrusions 111 and a recessed region 112 between the plurality of protrusions 111. The light emitting layer 12 includes a first region 12a, a second region 12b and a third region 12c. The first region 12a is configured to cover the recessed region 112, the second region 12b is configured to cover side walls of the plurality of protrusions 111, the third region 12c is configured to cover top walls of the plurality of protruding 111. Since positions of the first region 12a, the second region 12b and the third region 12c are different, a growth temperature of the positions is different.

Figure 2B:
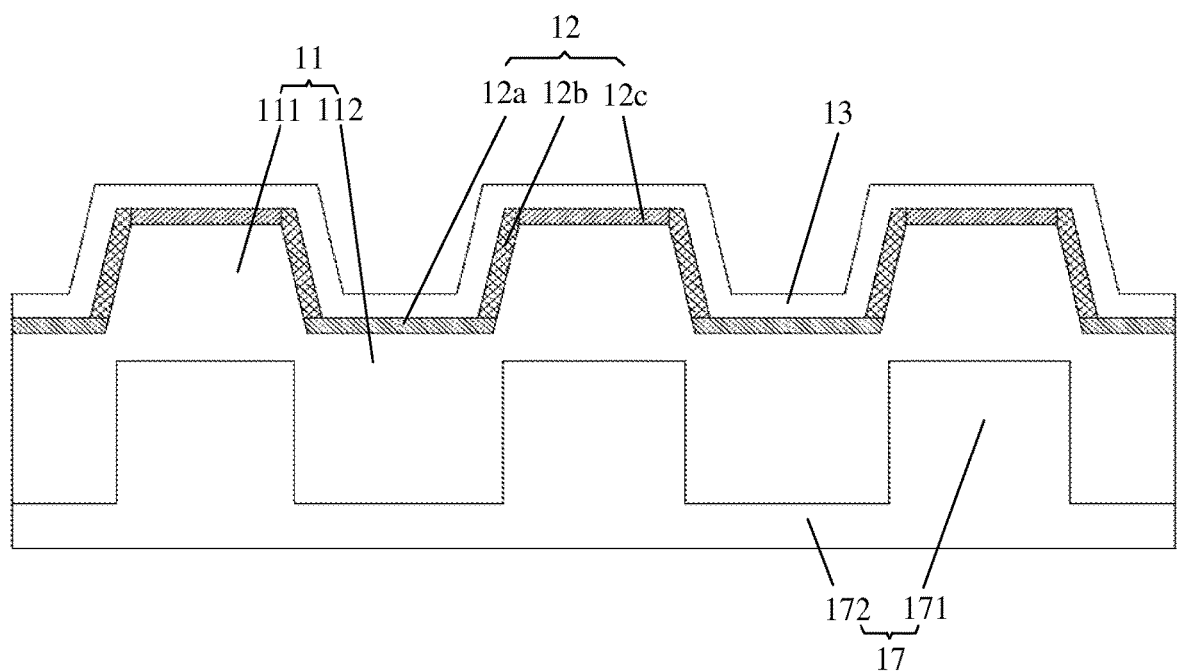
FIG. 2b is another schematic cross-sectional view of the light emitting device in N-N direction shown in FIG. 1.

FIG. 2b is another schematic cross-sectional view of the light emitting device in N-N direction shown in FIG. 1. As shown in FIG. 1 and FIG. 2b, the light emitting device according to an embodiment of the present application further includes a substrate 17. The substrate 17 includes a plurality of protrusion portions 171 and a recessed portion 172 between the plurality of protrusion portions 171.

In an embodiment of the present application, the light emitting layer 12 includes a single quantum well layer or a multiple quantum well layer. The single quantum well layer or the multiple quantum well layer includes element In. Due to temperature, location and the sidewall of the protrusion 111 being a semi-polar surface, etc., a doping rate of element In of the light emitting layer 12 in the first region 12a, the second region 12b, and the third region 12c is different, that is, a doping efficiency of the element In is different, which makes a composition ratio of the element In in the grown light emitting layer 12 different.

Specifically, a material of the first semiconductor layer 11 may be a III-V group compound, and may specifically include at least one of GaN and AlGaN. In this embodiment, a certain material is represented by a chemical element, but a molar ratio of each chemical element in the material is not limited. For example, in GaN material, element Ga and element N are included, but a molar ratio of element Ga and element N are not limited; in AlGaN material, three elements, Al, Ga, and N are included, but a molar ratio of each element is not limited. The light emitting layer 12 may be made of a III-V group compound. Specifically, the light emitting layer 12 may be made of a GaN-based material, in which element In may be doped, for example, InGaN. In other embodiments, other light emitting wavelength sensitive elements may also be doped.

Specifically, the second semiconductor layer 13 covers the light emitting layer 12. A conductive type of the second semiconductor layer 13 is opposite to a conductive type of the first semiconductor layer 11. The second semiconductor layer 13 may be made of a III-V group compound. Specifically, the second semiconductor layer 13 may include at least one of GaN and AlGaN.

In this embodiment, the conductivity type of the first semiconductor layer 11 may be N-type, and N-type doping ions may be at least one of Si ions, Ge ions, Sn ions, Se ions or Te ions. The conductivity type of the second semiconductor layer 13 may be P-type, and P-type doping ions may be at least one of Mg ions, Zn ions, Ca ions, Sr ions or Ba ions.

The light emitting device of the present application may be formed by an epitaxial growth process. The light emitting device according to the embodiments of the present application includes the first semiconductor layer 11, the light emitting layer 12 and a second semiconductor layer 13. Light emitting wavelengths of the first region 12a, the second region 12b and the third region 12c are different by setting composition of the light emitting layer 12 of the top walls of the plurality of protrusions 111, the side walls of the plurality of protrusions 111 and the recessed region 112 between the plurality of protrusions 111 to be different. Therefore, the light emitting device may emit light of different wavelengths without using phosphors or quantum dots for wavelength conversion, thereby prolonging lifetimes of the light emitting device and improving reliability of the light emitting device.

Figure 3:
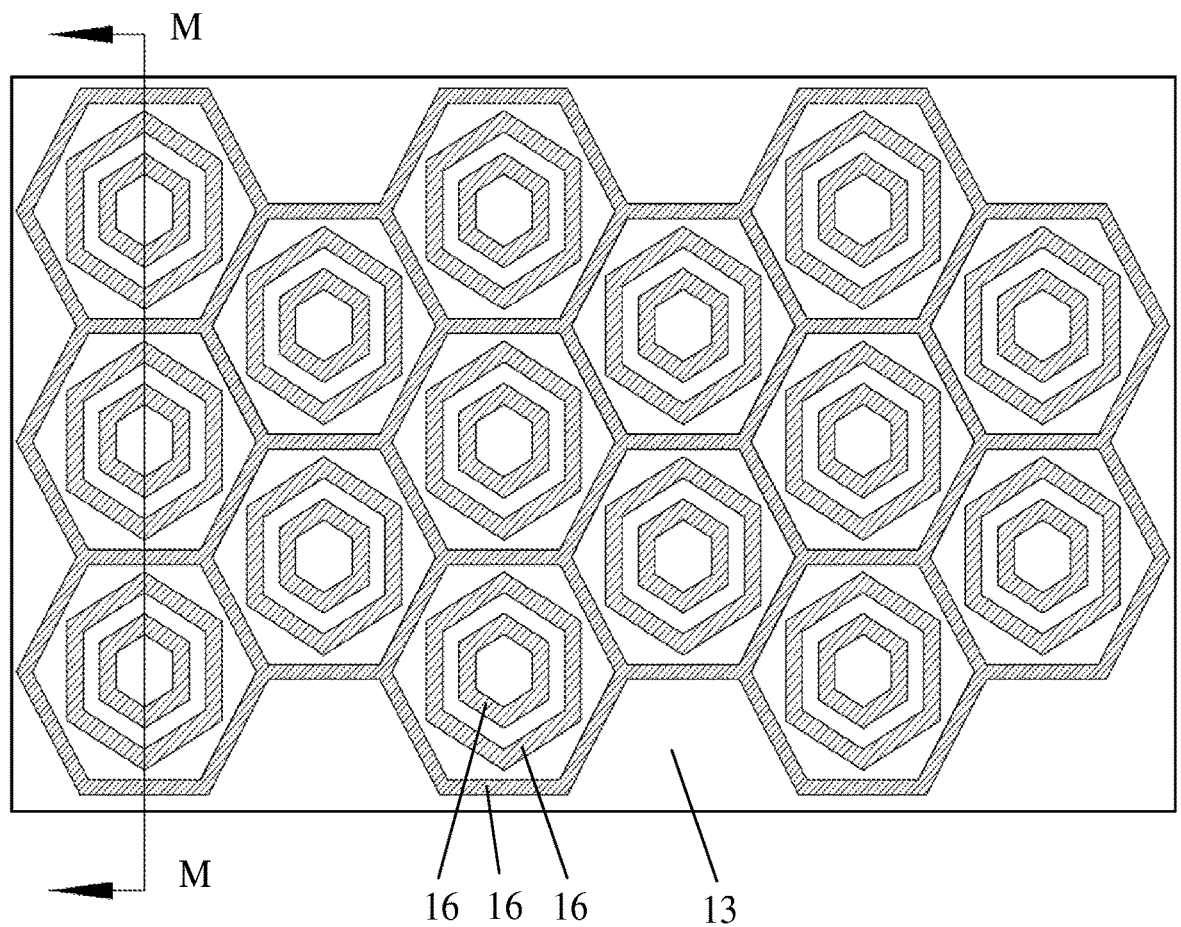
FIG. 3 is a schematic top view of a light emitting device according to another embodiment of the present application.
Figure 4A:
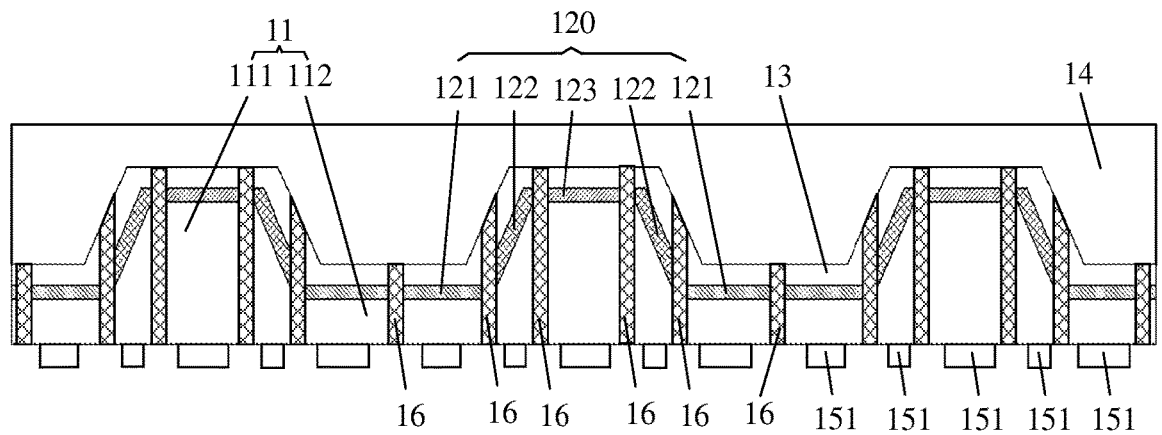
FIG. 4a is a schematic cross-sectional view of the light emitting device in M-M direction shown in FIG. 3.

FIG. 3 is a schematic top view of a light emitting device according to another embodiment of the present application. FIG. 4a is a schematic cross-sectional view of the light emitting device in M-M direction shown in FIG. 3. As shown in FIG. 3 and FIG. 4a, the light emitting layer 12 includes a plurality of light emitting units 120. Each of the plurality of light emitting units 120 includes a first light emitting sub-region 121, a second light emitting sub-region 122 and a third light emitting sub-region 123. An insulating wall 16 is disposed at a junction of the first light emitting sub-region 121, the second light emitting sub-region 122 and the third light emitting sub-region 123. The insulating wall 16 is disposed between adjacent light emitting units 120. The first light emitting sub-region 121 is located in the first region 12a, the second light emitting sub-region 122 is located in the second region 12b and the third light emitting sub-region 123 is located in the third region 12c. Exemplarily, the first region 12a emits blue light, the second region 12b emits green light, and the third region 12c emits red light. A material of the insulating wall 16 may be silicon dioxide or other insulating materials, as long as an insulating effect may be achieved, which is not specifically limited in this application.

In an embodiment of the present application, parts of the first region 12a, the second region 12b and the third region 12c that do not correspond to the first light emitting sub-region 121, the second light emitting sub-region 122 and the third light emitting sub-region 123 may be provided the insulating wall 16.

In an embodiment of the present application, the light emitting device further includes: a first metal electrode layer and a second metal electrode layer 14. The first metal electrode layer is disposed on a surface of the first semiconductor layer 11 away from the light emitting layer 12. The second metal electrode layer 14 is disposed on a surface of the second semiconductor layer 13 away from the light emitting layer 12.

Specifically, as shown in FIG. 4a, the first metal electrode layer includes a plurality of first metal electrodes 151. The first light emitting sub-region 121, the second light emitting sub-region 122 and the third light emitting sub-region 123 of each of the plurality of light emitting units 120 correspond to respective first metal electrodes 151. The first light emitting sub-region 121, the second light emitting sub-region 122 and the third light emitting sub-region 123 of the plurality of light emitting units share the second metal electrode layer 14. The first metal electrode layer may be a cathode. The second metal electrode layer 14 may be an anode.

By disposing the insulating wall 16 at the junction of the first light emitting sub-region 121, the second light emitting sub-region 122 and the third light emitting sub-region 123, light of different colors emitted by different sub-regions may be isolated. Then one first metal electrode 151 corresponds to only one sub-region, so that each of the first light emitting sub-regions 121, the second light emitting sub-region 122 and the third light emitting sub-region 123 may be individually controlled to emit light or not, so as to realize full color.

In an embodiment of the present application, an area of first light emitting sub-regions 121 included in the plurality of light emitting units 120 accounts for between 0% and 90% of an area of the recessed region 112. That is, in the plurality of first light emitting sub-regions 121 included in the plurality of light emitting units 120, only a part of the first light emitting sub-regions 121 may emit light, and another part of the first light emitting sub-regions 121 may not emit light. An area of the second light emitting sub-regions 122 accounts for between 0% and 90% of an area of side walls of the plurality of protrusions 111 corresponding to the second light emitting sub-region 122. An area of the third light emitting sub-regions 123 accounts for between 0% and 90% of an area of top walls of the plurality of protrusions 111 corresponding to the third light emitting sub-region 123.

In an embodiment of the present application, the plurality of protrusions 111 are protruding platforms. A shapes of top surfaces of the protrusion 11 include at least one of the following shapes: triangle, square, rectangle, hexagon, octagon, circle. The shapes of top surfaces of the protrusion 111 may also be other shapes, which are not specifically limited in this application. In an embodiment of the present application, a shape of the light emitting unit 120 is a hexagon, but it is not limited thereto. The shape of the light emitting unit 120 may also be a rectangle or a triangle, or other polygons or circles.

In an embodiment of the present application, each of the plurality of light emitting units 120 corresponds to at least one protrusion 111. The first light emitting sub-region 121 corresponds to recessed region 112 adjacent to the at least one protrusion 111. The second light emitting sub-region 122 corresponds to side walls of the at least one protrusion 111. The third light emitting sub-region 123 corresponds to at least one top wall of the at least one protrusion 111.

Figure 4B:
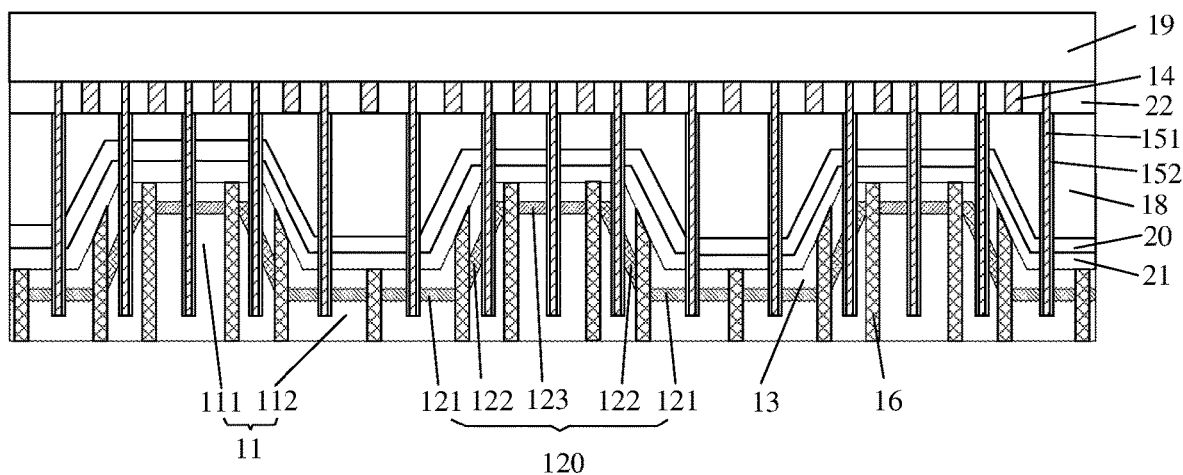
FIG. 4b is a schematic cross-sectional view of a light emitting device according to another embodiment of the present application.

FIG. 4b is a schematic cross-sectional view of a light emitting device according to another embodiment of the present application. As shown in FIG. 4b, the light emitting device further includes: a bonding material layer 18, a driving backplane 19, a transparent electrode layer 20, a reflector mirror metal layer 21, a connection layer 22 and a passivation layer 152. A portion of the first metal electrode 151 penetrating the first semiconductor layer 11 to the bonding material layer 18 is wrapped by the passivation layer 152.

Figure 5:
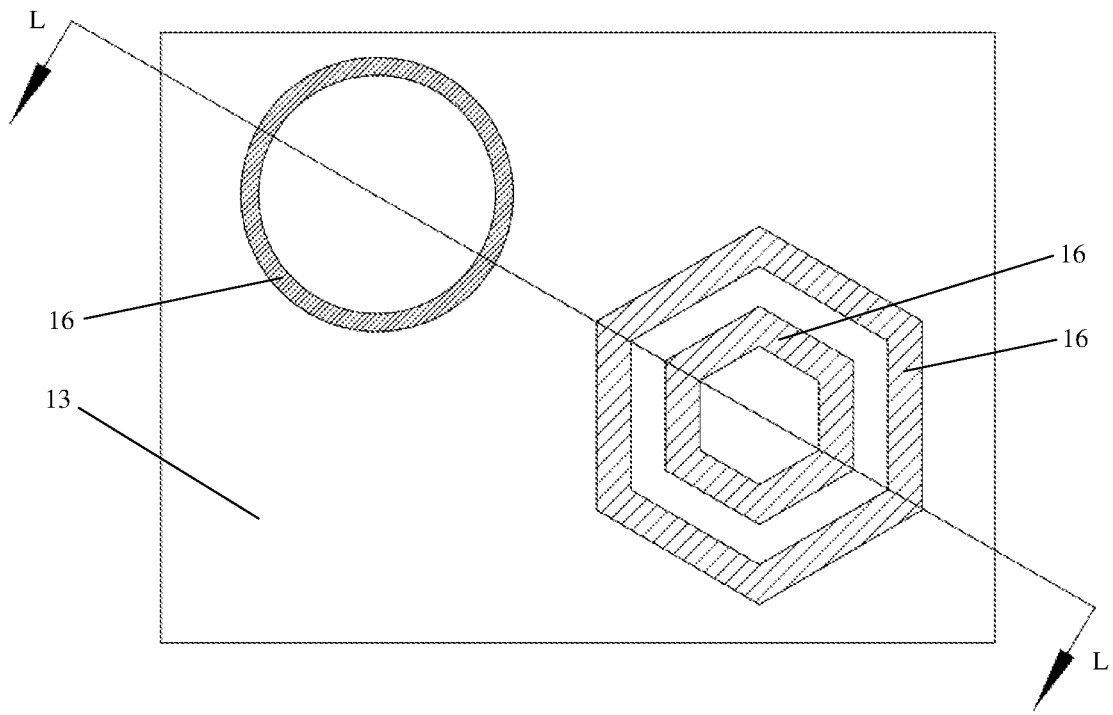
FIG. 5 is a schematic top view of a light emitting device according to another embodiment of the present application.
Figure 6:
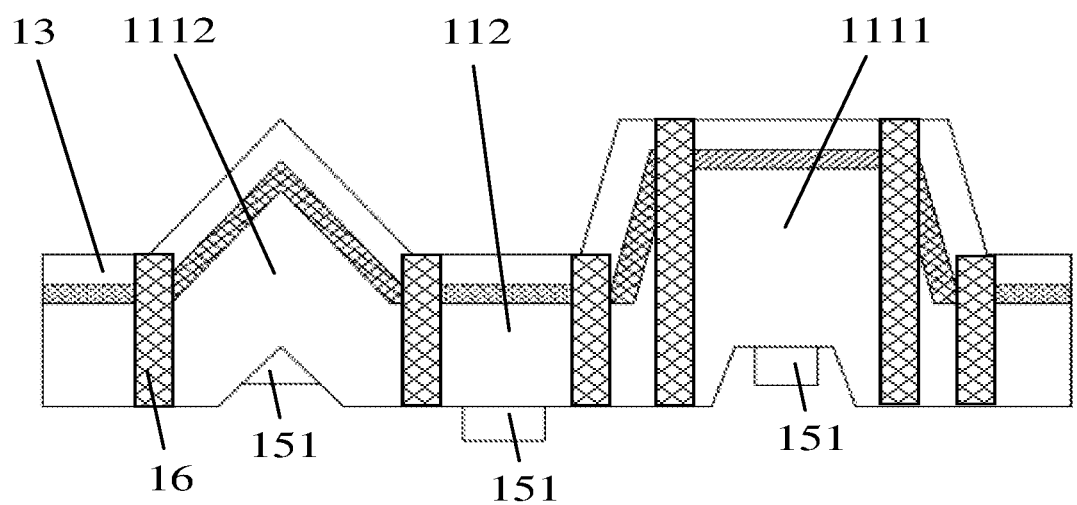
FIG. 6 is a schematic cross-sectional view of the light emitting device in L-L direction shown in FIG. 5.

FIG. 5 is a schematic top view of a light emitting device according to another embodiment of the present application. FIG. 6 is a schematic cross-sectional view of the light emitting device in L-L direction shown in FIG. 5. As shown in FIG. 5 and FIG. 6, the plurality of protrusions 111 include a first protrusion 1111 and a second protrusion 1112. The first protrusion 1111 is a protruding platform, the second protrusion 1112 is a cone, and a horizontal size of the first protrusion 1111 is larger than a horizontal size of the second protrusion 1112.

In an embodiment of the present application, each of the plurality of light emitting units 120 corresponds to at least one first protrusion 1111, at least one second protrusion 1112, and a recessed region 112 between at least one the first protrusion 1111 and the at least one second protrusion 1112. The first light emitting sub-region 121 corresponds to the recessed region 112. the second light emitting sub-region 122 corresponds to side walls of the at least one second protrusion 1112, and the third light emitting sub-region 123 corresponds to top walls of the at least one first protrusion 1111.

In an embodiment of the present application, a ratio of a number of the first protrusions 1111 and a number of the second protrusions 1112 included in the light emitting unit 120 may be 1:1, 1:2, or 2:1. This application does not specifically limit the number of the first protrusions 1111 and the number of the second protrusions 1112 in the light emitting unit 120.

In an embodiment of the present application, the plurality of light emitting units 120 include a first type of light emitting unit 124 and a second type of light emitting unit 125. Light emitting area of the first type of light emitting unit 124 is larger than light emitting area of the second type of light emitting unit 125, and a number of the protrusion 111 corresponding to the first type of light emitting unit 124 and a number of the protrusion 111 corresponding to the second type of light emitting unit 125 are same or different. A type of the protrusion 111 corresponding to the first type of light emitting unit 124 and a type of the protrusion 111 corresponding to the second type of light emitting unit 125 are same or different. For example, the type of the protrusion 111 corresponding to the first type of light emitting unit 124 may be a protruding platform, and the type of the protrusion 111 corresponding to the second type of light emitting unit 125 may be a cone, which is not specifically limited in the present application.

In an embodiment of the present application, a spacing between the plurality of protrusions 111 is less than 50 microns.

In an embodiment of the present application, an arrangement of the plurality of protrusions including any one of the following arrangements: a rectangular array arrangement and a diamond arrangement.

Heights of the plurality of protrusions 111 are less than 50 microns.

In an embodiment of the present application, the insulating wall 16 penetrates through the first semiconductor layer 11, the light emitting layer 12 and the second semiconductor layer 13, so that the insulating wall 16 may better isolate lights of different colors emitted from different sub-regions and avoid color mixing, which improves accuracy of full color.

In an embodiment of the present application, the second metal electrode layer 14 includes a reflector mirror conductive material layer, a metal conductive material layer, a first silicon substrate and a first metal electrode.

The reflector mirror conductive material layer is disposed on a surface of the second semiconductor layer away from the light emitting layer. The metal conductive material layer is disposed on a surface of the reflector mirror conductive material layer away from the second semiconductor layer. The first silicon substrate is disposed on a surface of the metal conductive material layer away from the reflector mirror conductive material layer. The first metal electrode is disposed on a surface of the first silicon substrate away from the metal conductive material layer. A material of the reflector mirror conductive material layer may be silver (Ag), Distributed Bragg Reflection (DBR) and so on.

In an embodiment of the present application, the insulating wall 16 is disposed on entire region of the first light emitting sub-region 121, entire region of the second light emitting sub-region 122 or entire region of the third light emitting sub-region 123. A material of the insulating wall 16 may be a transparent material to form a transparent insulating wall, for example, SiN, SiO2, ITO, etc. The transparent insulating wall reduces a blocking of light emitted by the second light emitting sub-region 122 covering the sidewall of the protrusion, so as to increase light extraction efficiency of the second light emitting sub-region 122. The first metal electrode 151 may be disposed above the transparent insulating wall to avoid blocking the light emitted by the second light emitting sub-region 122, thereby improving the light emitting efficiency of the second light emitting sub-region 122.

Figure 7:
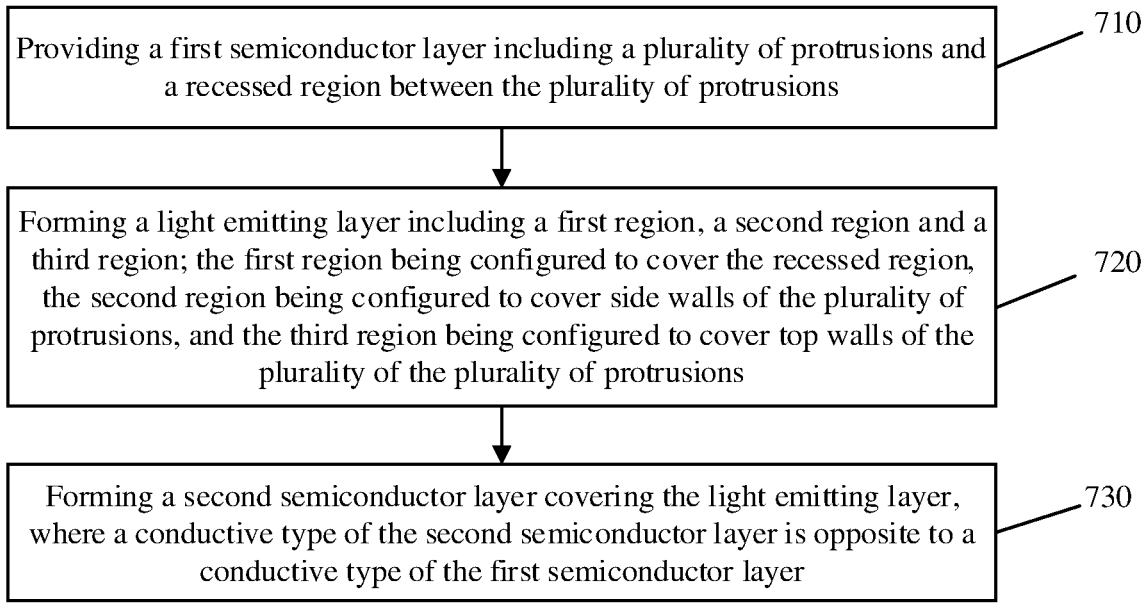
FIG. 7 is a schematic flowchart of a method for manufacturing a light emitting device according to an embodiment of the present application.

FIG. 7 is a schematic flowchart of a method for manufacturing a light emitting device according to an embodiment of the present application. As shown in FIG. 7, the method for manufacturing a light emitting device according to an embodiment of the present application includes the following steps.

Step 710, providing a first semiconductor layer including a plurality of protrusions and a recessed region between the plurality of protrusions.

Specifically, the first semiconductor layer may be formed on a patterned substrate, such that the first semiconductor layer includes the plurality of protrusions and the recessed region between the plurality of protrusions. The present application does not specifically limit a process of forming the first semiconductor layer.

In an embodiment of the present application, the providing a first semiconductor layer includes: providing a substrate, and then performing epitaxial growth on the substrate to obtain the first semiconductor layer including the plurality of protrusions and a recessed region between the plurality of protrusions. As shown in FIG. 2b, the substrate 17 includes a plurality of protrusion portions 171 and the recessed portion 172 between the plurality of protrusion portions.

Specifically, the substrate may be a silicon-based substrate. Realization of luminescence in different bands at different locations has the following effects: stress, thermal field, polarization field and a growth rate.

For a silicon-based LED, stress of the light emitting layer corresponding to the top wall and the side wall of the protrusion portions of the substrate, and the recessed region between the protrusion portions is from small to large, and a wavelength is from long to short. By adjusting the stress, blue light, green light and red light may be realized.

A first semiconductor layer is epitaxially grown on the patterned substrate. In an epitaxial growth process, since the substrate is patterned, a groove and a top surface of the substrate are heated differently, thereby affecting incorporation efficiency of element In. The higher the temperature, the less the incorporation of element In, and the shorter the wavelength.

A sidewall of the protrusion portions is semipolar surfaces. Therefore, a doping efficiency of the element In of the light emitting layer corresponding to the sidewall of the protrusion portion is lower than that of a nonpolar surface (ie, plane).

In addition, a growth rate of the light emitting layer corresponding to the sidewall of the protrusion portion is slow. A thickness of an active region is thin, and a wavelength is short.

Step 720, forming a light emitting layer including a first region, a second region and a third region; the first region being configured to cover the recessed region, the second region being configured to cover side walls of the plurality of protrusions, and the third region being configured to cover top walls of the plurality of the plurality of protrusions.

Specifically, the light emitting layer is formed through a growth process. The growth process of the light emitting layer may include: Atomic Layer Deposition (ALD), or Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

Step 730, forming a second semiconductor layer covering the light emitting layer, where a conductive type of the second semiconductor layer is opposite to a conductive type of the first semiconductor layer.

Specifically, materials of the first semiconductor layer, the light emitting layer and the second semiconductor layer are all III-V group compounds. A growth process of the second semiconductor layer may refer to the aforementioned growth process of the light emitting layer. The conductivity type of the second semiconductor layer 13 may be P-type, and P-type doping ions may be at least one of Mg ions, Zn ions, Ca ions, Sr ions or Ba ions.

Since positions of the first region 12a, the second region 12b and the third region 12c are different, growth temperatures of the positions are different. The light emitting layer 12 includes a single quantum well layer or a multiple quantum well layer. The single quantum well layer or the multiple quantum well layer includes element In. Due to temperature, location and the sidewall of the protrusion 111 being a semi-polar surface, etc., a doping rate of element In of the light emitting layer 12 in the first region 12a, the second region 12b, and the third region 12c is different, that is, a doping efficiency of the element In is different, which makes a composition ratio of the element In in the grown light emitting layer 12 different. Light emitting wavelengths of the first region, the second region and the third region are different by setting composition of the light emitting layer of the top walls of the plurality of protrusions, the side walls of the plurality of protrusions and the recessed region between the plurality of protrusions to be different.

Figure 8:
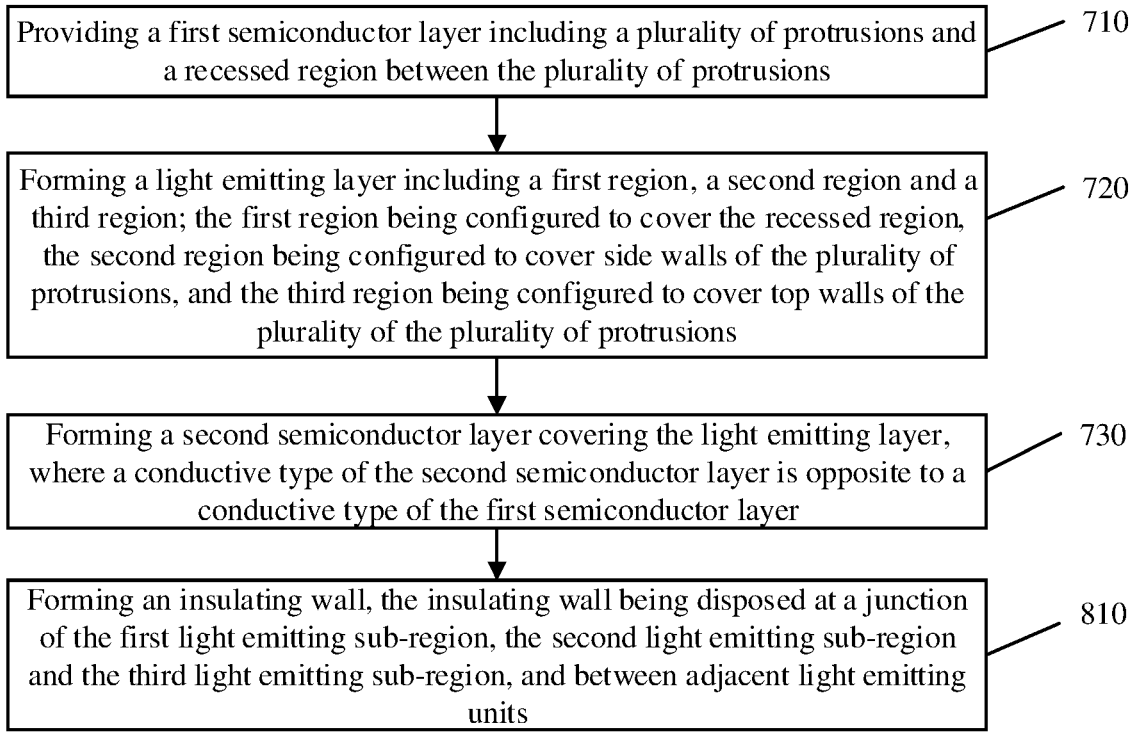
FIG. 8 is a schematic flowchart of a method for manufacturing a light emitting device according to another embodiment of the present application.

FIG. 8 is a schematic flowchart of a method for manufacturing a light emitting device according to another embodiment of the present application. The embodiment of the present application shown in FIG. 8 is extended based on the embodiment of the present application shown in FIG. 7. Differences between the embodiment shown in FIG. 8 and the embodiment shown in FIG. 7 are emphatically described below, and similarities may not be described repeatedly.

As shown in FIG. 8, after the step of forming a second semiconductor layer covering the light emitting layer, the following step is also included.

Step 810, forming an insulating wall, the insulating wall being disposed at a junction of the first light emitting sub-region, the second light emitting sub-region and the third light emitting sub-region, and between adjacent light emitting units.

Specifically, after the second semiconductor layer is formed, a groove may be etched on the first semiconductor layer, the light emitting layer and the second semiconductor layer, and then the insulating wall are formed in the groove through a growth process. The light emitting layer includes: a plurality of light emitting units. The light emitting unit includes a first light emitting sub-region, a second light emitting sub-region and a third light emitting sub-region. The first light emitting sub-region is disposed on the first region, the second light emitting sub-region is disposed on the second region, and the third light emitting sub-region is disposed on the third region.

Figure 9:
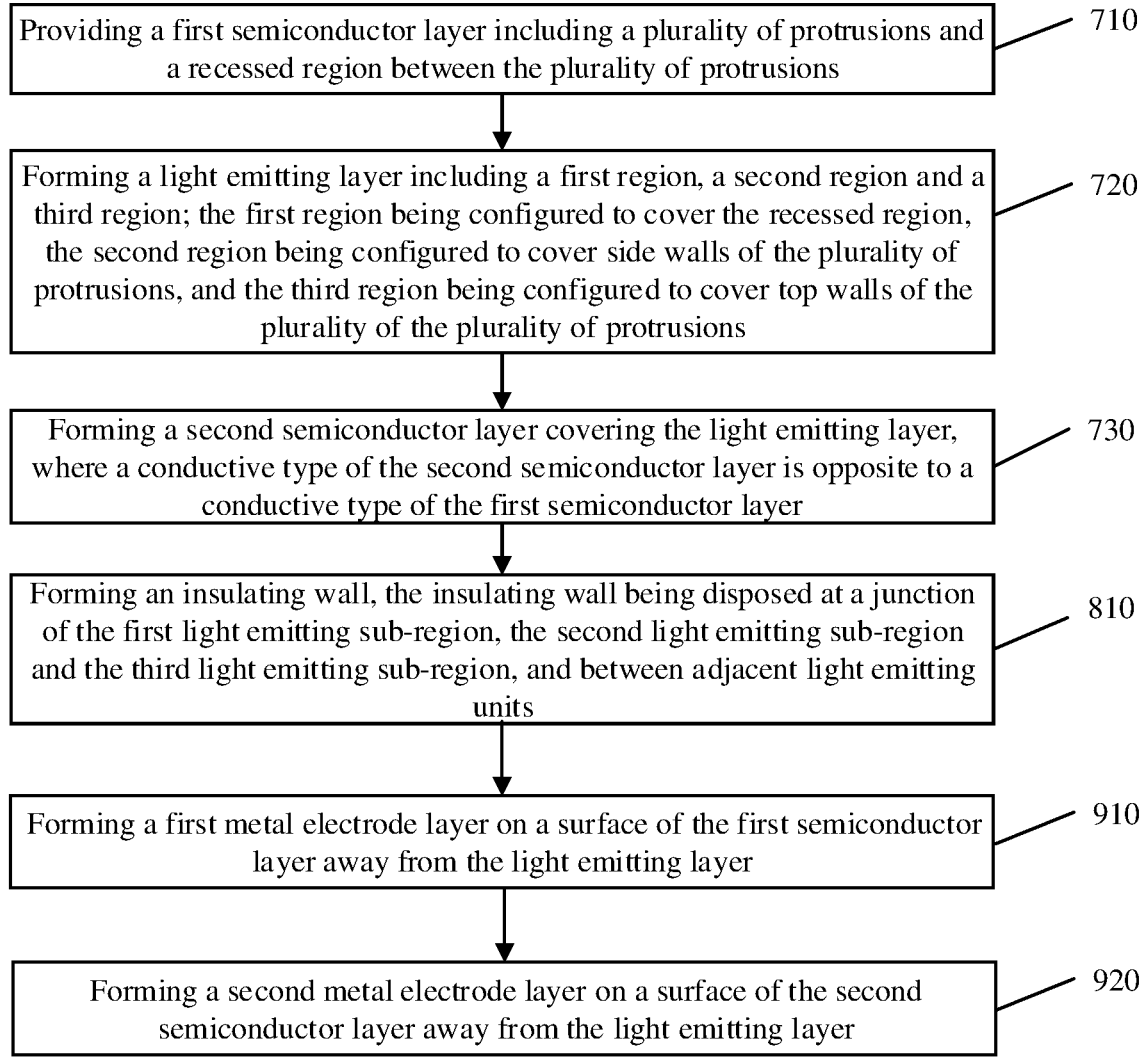
FIG. 9 is a schematic flowchart of a method for manufacturing a light emitting device according to another embodiment of the present application.

FIG. 9 is a schematic flowchart of a method for manufacturing a light emitting device according to another embodiment of the present application. The embodiment of the present application shown in FIG. 9 is extended based on the embodiment of the present application shown in FIG. 8. Differences between the embodiment shown in FIG. 9 and the embodiment shown in FIG. 8 are emphatically described below, and similarities may not be described repeatedly.

As shown in FIG. 9, after the step of forming an insulating wall, the following steps are also included.

Step 910, forming a first metal electrode layer on a surface of the first semiconductor layer away from the light emitting layer.

Step 920, forming a second metal electrode layer on a surface of the second semiconductor layer away from the light emitting layer.

Specifically, a growth process of the first metal electrode layer and the second metal electrode layer, may refer to the aforementioned growth process of the light emitting layer, which may not be repeated here.

Specifically, the first metal electrode layer includes a plurality of first metal electrodes. The first light emitting sub-region, the second light emitting sub-region and the third light emitting sub-region of the light emitting units correspond to respective first metal electrodes. The first light emitting sub-region, the second light emitting sub-region and the third light emitting sub-region of the light emitting units share the second metal electrode layer.

Figure 10:
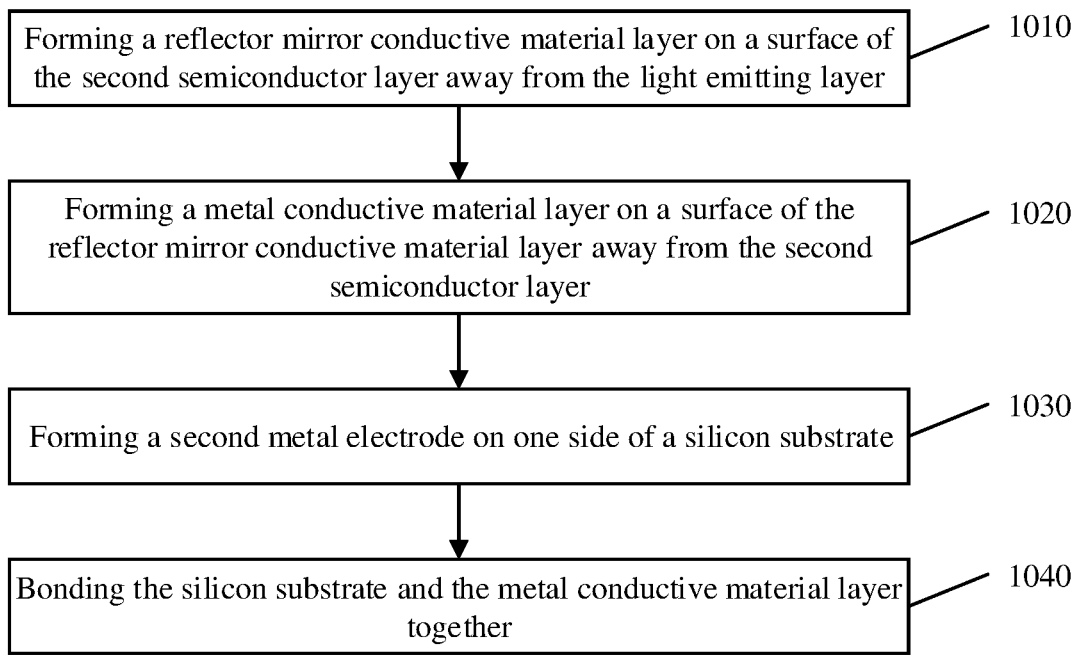
FIG. 10 is a schematic flowchart of a method for manufacturing a light emitting device according to another embodiment of the present application.

FIG. 10 is a schematic flowchart of a method for manufacturing a light emitting device according to another embodiment of the present application. The embodiment of the present application shown in FIG. 10 is extended based on the embodiment of the present application shown in FIG. 9. Differences between the embodiment shown in FIG. 10 and the embodiment shown in FIG. 9 are emphatically described below, and similarities may not be described repeatedly.

As shown in FIG. 10, the step of forming a second metal electrode layer on a surface of the second semiconductor layer away from the light emitting layer, includes the following steps.

Step 1010, forming a reflector mirror conductive material layer on a surface of the second semiconductor layer away from the light emitting layer.

Specifically, the reflector mirror conductive material layer may be formed by epitaxial growth.

Step 1020, forming a metal conductive material layer on a surface of the reflector mirror conductive material layer away from the second semiconductor layer.

Step 1030, forming a second metal electrode on one side of a silicon substrate.

Step 1040, bonding the silicon substrate and the metal conductive material layer together.

Figure 11:
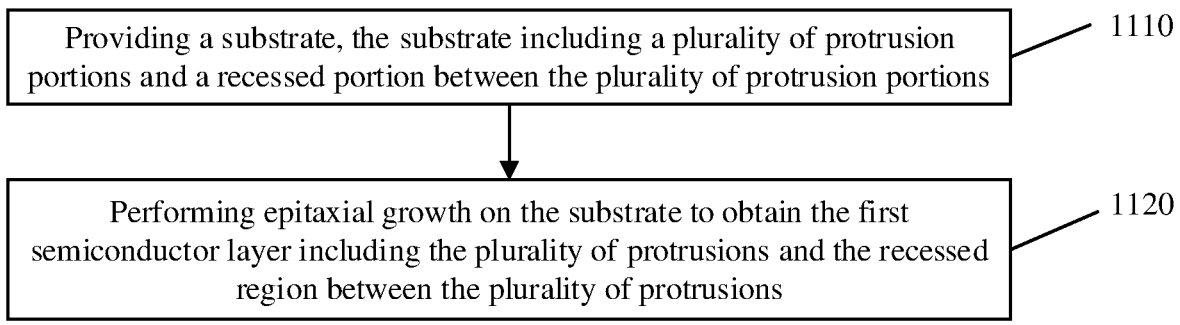
FIG. 11 is a schematic flowchart of a method for manufacturing a light emitting device according to another embodiment of the present application.

FIG. 11 is a schematic flowchart of a method for manufacturing a light emitting device according to another embodiment of the present application. The embodiment of the present application shown in FIG. 11 is extended based on the embodiment of the present application shown in FIG. 7. Differences between the embodiment shown in FIG. 11 and the embodiment shown in FIG. 7 are emphatically described below, and similarities may not be described repeatedly.

As shown in FIG. 11, the step of providing a first semiconductor layer, includes the following steps.

Step 1110, providing a substrate, the substrate including a plurality of protrusion portions and a recessed portion between the plurality of protrusion portions.

Step 1120, performing epitaxial growth on the substrate to obtain the first semiconductor layer including the plurality of protrusions and the recessed region between the plurality of protrusions.

In this application, unless otherwise expressly stated and defined, a first feature being "on" or "under" a second feature may mean that the first feature in direct contact with the second feature, or the first feature and the second feature in indirect contact through an intermediate medium. Also, the first feature being "above", "over" and "on a surface of" the second feature may mean that the first feature is directly above or obliquely above the second feature, or simply means that a horizontal height of the first feature is higher than a horizontal height of the second feature. The first feature being "below", "lower" and "under a surface of" the second feature may mean that the first feature is directly below or obliquely below the second feature, or simply means that a horizontal height of the first feature is less than a horizontal height of the second feature.

In the description of this specification, description with reference to the terms "an embodiment," "some embodiments," "example," "specific example," or "some examples" and so on, mean specific features described in connection with the embodiment or example, structure, material or feature is included in at least one embodiment or example of the present application. In this description, schematic representations of the above terms are not necessarily directed to the same embodiment or example. Furthermore, the particular features, structures, materials or characteristics described may be combined in any suitable manner in any one or more embodiments or examples. Furthermore, those skilled in the art may combine and constitute the different embodiments or examples described in this specification, as well as the features of the different embodiments or examples, without conflicting each other.

The above embodiments are only the preferred embodiments of the present disclosure, and are not intended to limit the protection scope of the present disclosure. Any modifications, equivalent replacements, improvements, etc. made within the spirit and principles of the present disclosure should be included within the protection scope of the present disclosure.

What is claimed is:

1. A light emitting device, comprising:
   a first semiconductor layer comprising a plurality of protrusions and a recessed region between the plurality of protrusions;
   a light emitting layer comprising a first region, a second region and a third region; the first region being configured to cover the recessed region, the second region being configured to cover side walls of the plurality of protrusions, and the third region being configured to cover top walls of the plurality of protrusions; and
   a second semiconductor layer covering the light emitting layer, wherein a conductive type of the second semiconductor layer is opposite to a conductive type of the first semiconductor layer;
   wherein light emitting wavelengths of the first region, the second region and the third region are different with different compositions of the light emitting layer of the top walls of the plurality of protrusions, the side walls of the plurality of protrusions and the recessed region between the plurality of protrusions.

2. The light emitting device according to claim 1, wherein the light emitting layer comprises:
   a plurality of light emitting units, each of the plurality of light emitting units comprising a first light emitting sub-region, a second light emitting sub-region and a third light emitting sub-region, an insulating wall being disposed at a junction of the first light emitting sub-region, the second light emitting sub-region and the third light emitting sub-region, the insulating wall being disposed between adjacent light emitting units, the first light emitting sub-region being located in the first region, the second light emitting sub-region being located in the second region and the third light emitting sub-region being located in the third region.

3. The light emitting device according to claim 2, further comprising:
   a first metal electrode layer disposed on a surface of the first semiconductor layer away from the light emitting layer; and a second metal electrode layer disposed on a surface of the second semiconductor layer away from the light emitting layer;

wherein the first metal electrode layer comprises a plurality of first metal electrodes, the first light emitting sub-region, the second light emitting sub-region and the third light emitting sub-region of each of the plurality of light emitting units correspond to respective first metal electrodes, and the first light emitting sub-region, the second light emitting sub-region and the third light emitting sub-region of the plurality of light emitting units share the second metal electrode layer.

4. The light emitting device according to claim 2, wherein,
- an area of the first light emitting sub-regions comprised in the plurality of light emitting units accounts for between 0% and 90% of an area of the recessed region;
- an area of the second light emitting sub-regions accounts for between 0% and 90% of an area of side walls of the plurality of protrusions corresponding to the second light emitting sub-region; and
- an area of the third light emitting sub-regions accounts for between 0% and 90% of an area of top walls of the plurality of protrusions corresponding to the third light emitting sub-region.

5. The light emitting device according to claim 2, wherein the plurality of protrusions are protruding platforms, and shapes of top surfaces of the plurality of protrusions comprise at least one of the following shapes: triangle, square, rectangle, hexagon, octagon, circle.

6. The light emitting device according to claim 5, wherein each of the plurality of light emitting units corresponds to at least one protrusion, the first light emitting sub-region corresponds to recessed region adjacent to the at least one protrusion, the second light emitting sub-region corresponds to side walls of the at least one protrusion, and the third light emitting sub-region corresponds to at least one top wall of the at least one protrusion.

7. The light emitting device according to claim 2, wherein the plurality of protrusions comprise a first protrusion and a second protrusion, the first protrusion is a protruding platform, the second protrusion is a cone, and a horizontal size of the first protrusion is larger than a horizontal size of the second protrusion.

8. The light emitting device according to claim 7, wherein each of the plurality of light emitting units corresponds to at least one first protrusion, at least one second protrusion and a recessed region between the at least one first protrusion and the at least one second protrusion, the first light emitting sub-region corresponds to the recessed region, the second light emitting sub-region corresponds to side walls of the at least one second protrusion, and the third light emitting sub-region corresponds to at least one top wall of the at least one first protrusion.

9. The light emitting device according to claim 2, wherein the plurality of light emitting units comprise a first type of light emitting unit and a second type of light emitting unit,
- a light emitting area of the first type of light emitting unit is larger than a light emitting area of the second type of light emitting unit, and
- a number of the protrusion corresponding to the first type of light emitting unit and a number of the protrusion corresponding to the second type of light emitting unit are same or different; and/or
- a type of the protrusion corresponding to the first type of light emitting unit and a type of the protrusion corresponding to the second type of light emitting unit are same or different.

10. The light emitting device according to claim 1, wherein a spacing between adjacent protrusions is less than 50 microns.

11. The light emitting device according to claim 1, wherein an arrangement of the plurality of protrusions comprises any one of the following arrangements: a rectangular array arrangement and a diamond arrangement.

12. The light emitting device according to claim 1, wherein heights of the plurality of protrusions are less than 50 microns.

13. The light emitting device according to claim 1, wherein the light emitting layer comprises a single quantum well layer or a multiple quantum well layer, and the single quantum well layer or the multiple quantum well layer comprises element In.

14. A method for manufacturing a light emitting device, comprising:
- providing a first semiconductor layer comprising a plurality of protrusions and a recessed region between the plurality of protrusions;
- forming a light emitting layer comprising a first region, a second region and a third region; the first region being configured to cover the recessed region, the second region being configured to cover side walls of the plurality of protrusions, and the third region being configured to cover top walls of the plurality of protrusions; and
- forming a second semiconductor layer covering the light emitting layer, wherein a conductive type of the second semiconductor layer is opposite to a conductive type of the first semiconductor layer;
- wherein light emitting wavelengths of the first region, the second region and the third region are different with different compositions of the light emitting layer of the top walls of the plurality of protrusions, the side walls of the plurality of protrusions and the recessed region between the plurality of protrusions.

15. The method for manufacturing a light emitting device according to claim 14, wherein the providing a first semiconductor layer comprises:
- providing a substrate comprising a plurality of protrusion portions and a recessed portion between the plurality of protrusion portions; and
- performing epitaxial growth on the substrate to obtain the first semiconductor layer comprising the plurality of protrusions and the recessed region between the plurality of protrusions.

* * * * *